(12) United States Patent
Chia

(10) Patent No.: US 11,342,497 B2
(45) Date of Patent: *May 24, 2022

(54) MAGNETIC MEMORY USING SPIN-ORBIT TORQUE

(71) Applicant: Everspin Technologies, Inc., Chandler, AZ (US)

(72) Inventor: Han-Jong Chia, Hsinchu (TW)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/165,092

(22) Filed: Feb. 2, 2021

(65) Prior Publication Data

US 2021/0159395 A1 May 27, 2021

Related U.S. Application Data

(63) Continuation of application No. 16/806,533, filed on Mar. 2, 2020, now Pat. No. 10,937,948, which is a
(Continued)

(51) Int. Cl.
| | |
|---|---|
| *G11C 11/00* | (2006.01) |
| *H01L 43/02* | (2006.01) |
| *G11C 11/16* | (2006.01) |
| *H01F 10/32* | (2006.01) |
| *H01L 27/22* | (2006.01) |
| *H01L 43/10* | (2006.01) |

(52) U.S. Cl.
CPC ............ *H01L 43/02* (2013.01); *G11C 11/161* (2013.01); *G11C 11/1675* (2013.01); *H01F 10/329* (2013.01); *H01F 10/3272* (2013.01); *H01F 10/3286* (2013.01); *H01L 27/228* (2013.01); *H01L 43/10* (2013.01)

(58) Field of Classification Search
CPC ....... H01L 43/02; H01L 27/228; H01L 43/10; G11C 11/161; G11C 11/1675; H01F 10/3272; H01F 10/3286; H01F 10/329
USPC .......................................................... 365/158
See application file for complete search history.

(56) References Cited

U.S. PATENT DOCUMENTS

| 10,622,547 B2 | 4/2020 | Chia | |
|---|---|---|---|
| 10,937,948 B2 * | 3/2021 | Chia | .................... H01L 27/228 |

(Continued)

OTHER PUBLICATIONS

Bhatti Sabpreet et al., Spintronics based random access memory: a review, Materials Today, vol. 20, No. 9, pp. 530-548, Elsevier, Amsterdam (Sep. 15, 2017).
(Continued)

*Primary Examiner* — Huan Hoang
(74) *Attorney, Agent, or Firm* — Bookoff McAndrews, PLLC

(57) ABSTRACT

Spin-orbit-torque (SOT) segments are provided along the sides of free layers in magnetoresistive devices that include magnetic tunnel junctions. Current flowing through such SOT segments injects spin current into the free layers such that spin torque is applied to the free layers. The spin torque can be used as an assist to spin-transfer torque generated by current flowing vertically through the magnetic tunnel junction in order to improve the efficiency of the switching current applied to the magnetoresistive device.

20 Claims, 5 Drawing Sheets

Related U.S. Application Data continuation of application No. 16/193,660, filed on Nov. 16, 2018, now Pat. No. 10,622,547.

(60) Provisional application No. 62/593,343, filed on Dec. 1, 2017.

(56) References Cited

U.S. PATENT DOCUMENTS

| | | | |
|---|---|---|---|
| 2014/0124882 A1* | 5/2014 | Khalili Amiri | H01L 43/10 257/421 |
| 2016/0079518 A1 | 3/2016 | Pi | |
| 2018/0190898 A1* | 7/2018 | Wang | H01L 27/226 |
| 2019/0115060 A1 | 4/2019 | Deshpande et al. | |
| 2020/0203599 A1 | 6/2020 | Chia | |

OTHER PUBLICATIONS

International Search Report dated May 14, 2019 for PCT/US2018/061565, 7 pages.

* cited by examiner

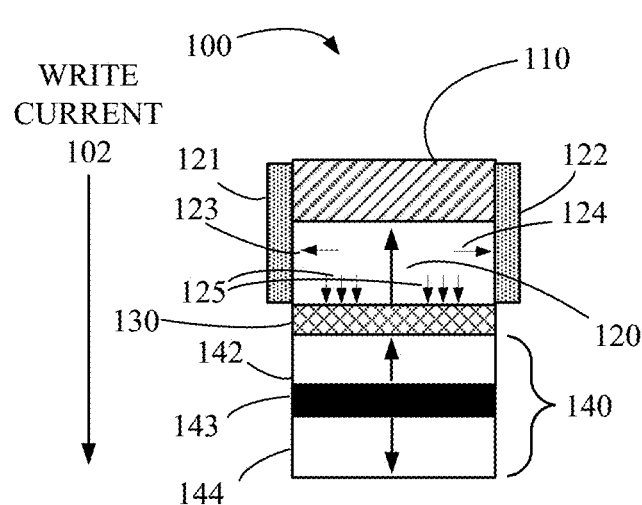
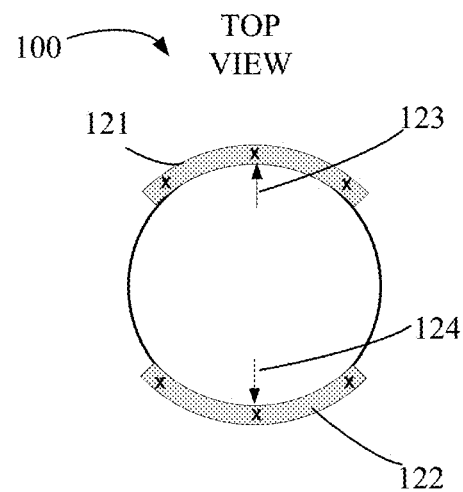
FIG. 1  FIG. 2
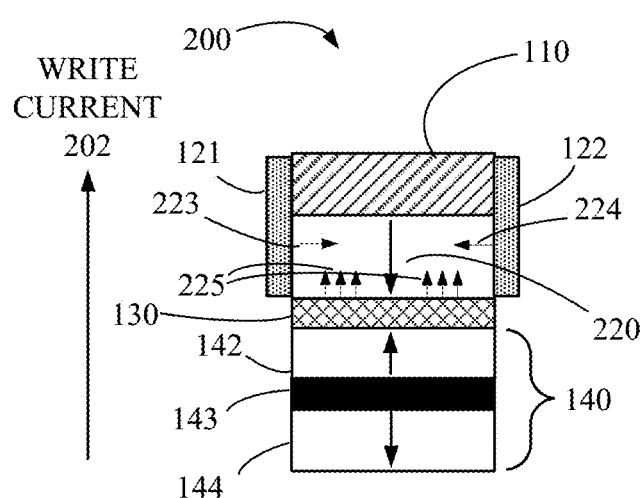
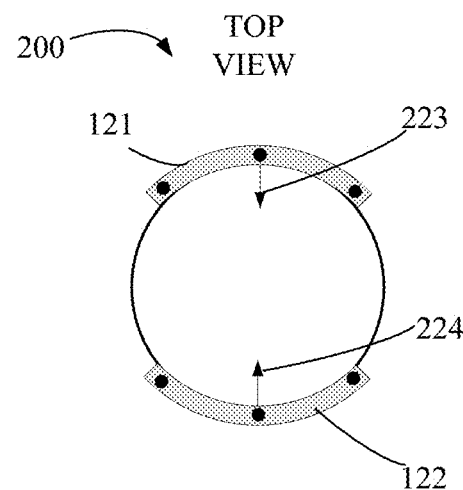
FIG. 3  FIG. 4

MAGNETIC MEMORY USING SPIN-ORBIT TORQUE

CROSS-REFERENCE TO RELATED APPLICATIONS

This application is a continuation of U.S. patent application Ser. No. 16/806,533, filed Mar. 2, 2020, which is a continuation of U.S. patent application Ser. No. 16/193,660, filed Nov. 16, 2018, now U.S. Pat. No. 10,622,547, issued Apr. 14, 2020, which claims the benefit of U.S. Provisional Application No. 62/593,343, filed Dec. 1, 2017, the disclosure of each of which is incorporated herein by reference in its entirety.

TECHNICAL FIELD

The present disclosure relates generally to spin-torque magnetic memory, and more particularly to using spin-orbit torque (SOT) together with spin-transfer torque (STT) in a magnetic memory.

BACKGROUND

Magnetoresistive memory devices store data based on varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that serves as a reference and has a fixed magnetic state. Another portion has a free magnetic state that is controlled to have magnetization either parallel or antiparallel to the fixed magnetic state. Because the resistance of the memory cell changes based on whether the magnetization of the free portion (free layer) is parallel or antiparallel to magnetization of the reference portion (reference layer), information can be stored by setting the magnetic orientation of the free layer. The information is later retrieved by sensing the resistance of the free layer. Such magnetic memory devices are known in the art.

Writing spin-torque magnetic memory cells can be accomplished by sending a write current through the memory device where the spin angular momentum carried by the current between the reference and free layers can change the magnetic state of the free layer. Depending on the direction of the current through the memory cell (e.g. up or down), the resulting magnetization of the free layer will either be parallel or antiparallel to the reference layer. If the parallel orientation represents a logic "0", the antiparallel orientation represents a logic "1", or vice versa. Thus, the direction of write current flowing through the memory device determines whether the memory cell is written to a first state or a second state. Such memory devices are often referred to as spin-transfer torque memory devices (STT-MRAM). In such memories, the magnitude of the write current is typically greater than the magnitude of a read current used to sense the information stored in the memory cells.

Because the magnitude of write current needed to switch the memory cells can be significant, repeated application of the write current through the magnetic tunnel junction can lead to breakdown of the magnetic tunnel junction over time. Therefore, it is desirable to provide techniques for switching the free layers of memory cells in a manner that avoids breakdown issues.

BRIEF DESCRIPTION OF THE DRAWINGS

FIG. 1 is a block diagram of magnetoresistive device in accordance with an exemplary embodiment;

FIG. 2 is a top-down perspective view of the magnetoresistive device of FIG. 1;

FIG. 3 is a block diagram of magnetoresistive device in accordance with an exemplary embodiment;

FIG. 4 is a top-down perspective view of the magnetoresistive device of FIG. 3;

DETAILED DESCRIPTION

Figures 5, 6:
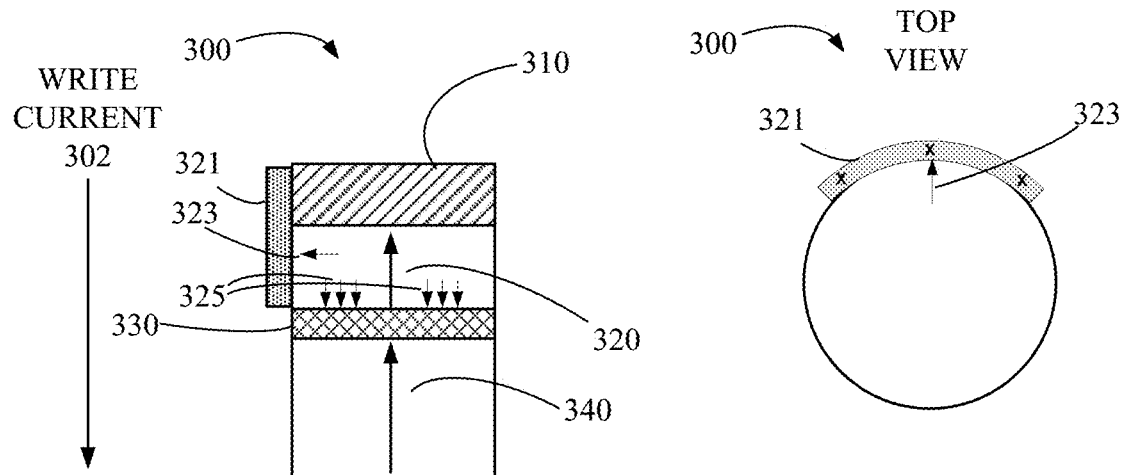
FIG. 5 is a block diagram of magnetoresistive device in accordance with an exemplary embodiment.
FIG. 6 is a top-down perspective view of the magnetoresistive device of FIG. 5.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, the operation of standard magnetic random access memory (MRAM) and the processing techniques used to manufacture of magnetoresistive devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Embodiments described herein utilize what is often referred to as spin-orbit torque (SOT) current to switch or aid in switching the magnetic state of the free layer in a magnetoresistive device that includes at least one magnetic tunnel junction (MTJ), where such a magnetoresistive device is often included in a memory cell in a magnetic memory. Current through a conductor adjacent to the free layer results in a spin torque acting on the free layer due to the injection of a spin current into the free layer from spin-dependent scattering of electrons in the conductor. Such a conductor can be referred to as a spin-orbit torque (SOT) segment, and is typically placed on a portion or the entirety of the sidewall of the free layer. The spin current is injected into the free layer in a direction perpendicular to the boundary where the free layer and the conductor meet. The direction of the torque applied by the SOT segment can depend on whether the SOT segment includes positive or negative SOT materials. For example, for current flowing in a first direction through a conductor, positive SOT materials generate spin current in one direction while negative SOT materials generate spin current in the opposite direction (180 degrees away). For current flowing in an opposite, second direction the spin currents generated by the positive and negative SOT materials will be reversed. The spin torque applied to the free layer by the spin current impacts the magnetic state of the free layer in a similar manner as spin-polarized tunneling current that flows through the MTJ in conventional spin-torque magnetic tunnel junctions.

The spin-orbit torque (SOT) supplied by spin current can be used to assist in changing the magnetic state of the free layer, where the SOT causes the magnetization of the free layer to be tilted off of its easy-axis, thereby making the magnetic state more susceptible to change in response to the application of spin-transfer torque (STT) from current that flows through the free layer. For example, in a perpendicular magnetoresistive device in which the easy-axis for the free layer is in a vertical direction that is perpendicular to the film plane in which the layers forming the MTJ are formed, the magnetic state of the free layer either points upward or downward in the steady state with no magnetic field applied. The SOT resulting from SOT current flowing vertically through the SOT segment is horizontal in direction and can cause the magnetic state of the free layer to tilt away from its vertical alignment, thereby rendering it more susceptible to switching in response to STT induced by additional STT current that flows through the free layer itself. In some embodiments, the combination of SOT and STT results in more efficient switching of the free layer, thereby reducing the amount of current needed to write data to the magnetoresistive devices. In some embodiments, when using the SOT current in switching the free layer for a write or reset operations, the amount of write current that flows through the tunnel barrier can be reduced, thereby reducing tunnel junction breakdown probabilities and promoting long-term functionality of memory devices.

As with write currents in conventional spin-torque memoires, when using SOT current, the direction of the torque applied by the spin current is dependent on the direction of the current flow in the conductor that is sourcing the SOT current. In other words, the direction of the current flow through the conductor adjacent to the free layer determines the direction of the torque that is applied to the free layer. In many embodiments described herein, the SOT is used as an assist in switching the free layer, and therefore, the directionality of the SOT is less important as it is only being used to "loosen" the magnetization of the free layer and render the magnetization of the free layer easier to switch.

Reading of the data stored by the MTJ in the magnetoresistive device is accomplished as in a typical spin-torque MTJ memory cell. For example, a read current, which has a lesser magnitude than that of a write current required to switch the free layer, is applied to the MTJ to sense the resistance of the magnetic tunnel junction. In some embodiments, the resistance sensed based on the read current can be compared with a reference resistance to determine the state of the free layer. In other embodiments, a self-referenced read operation is performed where the resistance through the MTJ is sensed, then the MTJ is written (or reset) so that the free layer is in a known state, and then the resistance is sensed again and compared with the resistance originally sensed. The original state of the free layer can then be determined based on whether the resistance has changed based on the write (reset) operation.

FIG. 1 illustrates a magnetoresistive device 100 that includes a magnetic tunnel junction. In some embodiments, the magnetoresistive devices shown in the FIGS. 1-14 are included in magnetic memory cells that can be used in embedded or standalone MRAM applications where high data retention and low switching current are beneficial.

The magnetoresistive device 100 and similar devices depicted in the FIGS. 3-14 includes an MTJ formed with a magnetoresistive stack that includes a plurality of layers. Each layer of the plurality of layers included in the magnetoresistive stack is formed, deposited, grown, sputtered, or otherwise provided. The layers may be deposited using any technique now known or later developed. In an example embodiment, the plurality of layers includes a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, antiferromagnetic material, and other layers utilized in magnetoresistive stacks as currently known or later developed.

In the magnetoresistive devices of FIGS. 1-14, including magnetoresistive device 100 depicted in FIG. 1, the orientation of the layers are illustrated with respect to an underlying substrate upon which the layers are formed. For example, in FIG. 1, the free layer 120 is further from the underlying substrate than the dielectric layer 130 and the reference layer 140. Therefore, the free layer 120 is "over" the layers 130 and 140, whereas the layers 140 and 130 are "under" the free layer 120. Moreover, the layers 120, 130, and 140 are vertically positioned with respect to the underlying substrate. One of ordinary skill in the art appreciates that the vertical positioning of the layers is generally associated with the processing operations used to form the devices.

In the magnetoresistive device of FIG. 1, a dielectric layer 130 forms a tunnel junction between a reference layer 140 and a free layer 120. The reference layer 140, which is shown to include ferromagnetic layers 142 and 144 that are antiferromagnetically coupled by coupling layer 143, has a predetermined magnetic state. The predetermined magnetic state of the reference layer 140 is indicated by the arrows within the reference layer 140 and is perpendicular to the plane in which the various layers are deposited. Thus, the reference layer 140 has stable magnetic states with magnetization direction perpendicular to the film plane.

While the reference layer 140 is illustrated to include a set of layers forming a synthetic antiferromagnetic structure or synthetic antiferromagnet (SAF), in other embodiments, it may include a set of layers forming a synthetic ferromagnetic structure (SyF). In yet other embodiments, the reference layer 140 is a single layer of material, where, in some embodiments the material is an alloy or composite material. Reference layer 140 may achieve its fixed magnetization in a number of different ways. For example, the reference layer can include antiferromagnetic material such as a platinum manganese alloy (Pt—Mn), a nickel manganese alloy (Ni—Mn), or an iridium manganese alloy (Ir—Mn), where such materials have a fixed magnetic state that can be used to influence other magnetic layers within the reference layer 140. For example, the reference layer 140 can include a SAF having antiferromagnetic material that is used to pin other ferromagnetic layers within the SAF such that the reference layer 140 is held in a predetermined magnetic state by the antiferromagnetic material. In other embodiments, the reference layer 140 includes an unpinned SAF having a magnetization that is typically fixed during manufacturing operations, but does not rely upon antiferromagnetic material. In yet other embodiments, the fixed magnetization of the reference layer 140 is achieved through other means, including the manner in which the reference layer 140 is formed (e.g. shape anisotropy).

While the free layer 120 shown in FIG. 1 is illustrated as a single layer of material, in other embodiments the free layer 120 includes two or more ferromagnetic layers separated by one or more coupling layers. Ferromagnetic layers included in embodiments described herein may include a variety of materials, including, for example, cobalt (Co), iron (Fe), and nickel (Ni) as well as alloys such as NiFe, CoFeB, CoNi, FeB CoB, CoFeB—X (where X can be Mo, W, and the like). The particular materials included in the ferromagnetic layers as well as the coupling layers can be selected in order to vary the characteristics of the magnetoresistive devices. In some embodiments one or more of the ferromagnetic layers includes multiple ferromagnetic materials that may or may not alloy together.

While not shown in FIG. 1, each magnetoresistive device can also include additional dielectric layers forming diffusion barriers or additional tunnel junctions. The magnetoresistive devices can also include spacer layers, which, when included in the stack, can increase the anisotropy of magnetic layers. In some embodiments, the dielectric layers (e.g. dielectric layer 130) included in the magnetoresistive stacks of the devices include, for example, one or more layers of aluminum oxide and/or magnesium oxide (MgO). While an exemplary stack structure is used to illustrate the concepts of the present disclosure, it should be appreciated that a multitude of variations of the general stack structure can be used in the various embodiments of the inventions disclosed herein. For example, other embodiments may include multiple SAFs, SyFs, and tunnel barriers in addition to the other layers, where the materials and structures are arranged in various combinations and permutations now known or later developed.

In FIG. 1 a top electrode 110 is included in the device 100, where, in some embodiments, the top electrode 110 is electrically connected to one of the current-carrying terminals of a selection transistor. The other current-carrying terminal of the selection transistor can be coupled to a common line such as a bit line or a source line that allows voltages to be applied across the MTJ and current to be applied through the MTJ of device 100. In other embodiments, the selection transistor is coupled to a bottom electrode for the magnetoresistive device, where such a bottom electrode would typically be below the reference layer 140 and is not shown in FIG. 1. Thus, the top electrode 110 can be directly coupled to a bit line or source line in some embodiments. The device depicted in FIG. 1 is a two-terminal device in that connections to the top and bottom allow current for reading and writing to be directed through the device.

As shown in FIG. 1, an SOT segment 121, 122 is provided on a sidewall of at least a portion of the free layer 120. In the embodiment shown in FIG. 1, the SOT segment 121, 122 includes two SOT sub-segments 121 and 122 that are on opposite sides of the free layer 120. The embodiment of FIG. 1 also shows the SOT segment 121, 122 extending over the entirety of the height of the free layer 120 as well as onto the sidewall of the top electrode 110. The top view perspective provided in FIG. 2 corresponds to the device in FIG. 1 and shows that the SOT sub-segments are on opposite sides of the free stack that includes the free layer 120. The geometry of the device 100 is depicted in FIG. 2 as having a circular footprint, as such geometries enable high-density perpendicular memory cell arrays. While the SOT segments 121, 122 are depicted as arcs with a certain thickness along the outer surface of the circular footprint of the free layer 120, it should be understood that other geometries are suitable for the embodiments described herein. For example, rather than being arc-shaped, the SOT segments could be rectangular. Similarly, while circular geometries for the magnetoresistive stack are depicted in the figures, other shapes can be selected where certain shapes may be advantageous for different applications.

In some embodiments in which the free layer 120 includes multiple magnetic layers that are ferromagnetically or antiferromagnetically coupled, the SOT segment 121, 122 only extends along the sidewall of one of the magnetic layers in the free layer 120. However, in other embodiments in which the free layer 120 includes multiple magnetic layers that are ferromagnetically or antiferromagnetically coupled, the SOT segment 121, 122 extends along the sidewall of or portion of the sidewall of all the magnetic layers in the free layer 120.

In the example depicted in FIG. 1, write current 102 is directed downward through the device 100, where a portion of the downward current flows from the top electrode 110 into the SOT segment 121, 122 and downward through the SOT segment 121, 122 before returning to the stack portion of the device 100 and continuing down through the dielectric layer 130 forming the tunnel barrier and the reference layer 140. In FIG. 2, the Xs shown in the SOT segments 121 and 122 represent current moving away from the viewer, thereby corresponding to current flowing from top to bottom in the magnetoresistive stack.

Current in the SOT segments, like current that flows through the free layer 120, can flow either upward or downward. Write current generation circuitry, which is not shown in FIG. 1, applies a bias voltage across the device 100 to generate current through the device 100 for writing, where the direction of the write current determines whether the magnetization of the free layer is forced to a first state or a second state. In one example, the first state corresponds to the magnetization of the free layer pointing upward (e.g. as depicted in FIG. 1), which, based on the magnetic layer 142 of the reference layer 140 having a magnetization pointing upward, is a lower-resistance (parallel) state than if the magnetization of the free layer 120 is pointing downward (anti-parallel). It should be noted that the magnetization of the SAF 140 shown in FIG. 1 could be reversed such that magnetic layer 142 has a downward magnetization and magnetic layer 144 has an upward magnetization. In some embodiments, the write current generation circuitry includes drivers that can included N-follower and/or P-follower circuits that are calibrated to apply the appropriate voltages on the first and second terminals of the device 100 to produce the desired current through the device 100. In other embodiments, the write current generation circuitry can include current sources that apply the desired currents.

When the write current generation circuitry applies write current 102 through the device 100, the current splits such that a portion of the current flows through the SOT segment 121, 122 and a portion of the current flows through the free layer 120 itself. The electrical current in the SOT segment 121, 122 causes a spin current to enter the free layer 120, where the spin current is perpendicular to the sidewall of the free layer 120 and parallel to the film plane. As shown in FIG. 1, the SOT resulting from downward directed write current 102 includes SOT vectors 123 and 124 which are directed outward from the center of the stack. If the embodiment illustrated in FIG. 1 is assumed to correspond to a SOT segment that includes either a positive or negative SOT material, then it should be understood that switching to the other type of SOT material would invert the SOT vectors 123 and 124 to point inward instead of outward. The torque applied by the SOT current causes the initially-upward magnetization of the free layer 120 to be tipped to the outside in at least a portion the free layer 120, thereby allowing the downward STT 125 applied by the current that flows through the free layer to more easily switch the free layer 120 from the first state (upward) to the second state (downward). Thus, the spin torque provided by the spin current resulting from the current flow through the SOT segment 121, 122 can be used to assist in switching the magnetic state of the free layer 120.

The device 100 pictured in FIG. 1 is a perpendicular device in that the easy axis of the free layer 120, as well as the easy axis of each of the magnetic layers 142 and 144 in the reference layer 140, is in the vertical direction and perpendicular to the film plane of the device 100. In some contexts, perpendicular devices such as that shown in FIG. 1 are preferable to "in-plane" devices in which the easy axis of the magnetic layers lies in the same plane as the film because the perpendicular devices are more scalable. The dimensions of perpendicular devices are more easily reduced without compromising their magnetic characteristics in comparison with in-plane devices. Note that in an embodiment in which the free layer has an in-plane easy-axis, SOT current can be used to switch the state of the free layer if the SOT segment is configured in a way to apply sufficient SOT to force the free layer magnetization to a desired state. For example, the SOT segment could be limited to one side of the free layer such that downward current applies SOT directed outward towards the segment whereas upward current would apply SOT directed inward away from the segment.

The division of the write current 102 into the current that flows through the SOT segment 121, 122 and the current that flows through the free layer 120 is based on the relative resistances of those portions of the device as perceived by the current flowing downward through the device. Tuning of the resistances of these portions of the device can be used to either balance or selectively unbalance the current flow through those portions of the device such that the amount of current in the SOT segment 121, 122 is about the same (+/−5%) or different than the amount of current that flows through the free layer 120. The current density through the SOT segment 121, 122 determines that amount of torque applied by the SOT current. As such, the determination as to desirable current levels in the SOT segment 121, 122 can be used to determine the total amount of write current needed as well as what percentage of that write current is expected to flow through the SOT segment 121, 122 versus the free layer 120. Tuning the resistance of the SOT segment 121, 122 can be accomplished by selecting the material for the SOT segment 121, 122 as well as the thickness of the segment. Similarly, the material and thickness of the free layer can be adjusted in order to tune the resistance of the free layer 120.

The SOT segment 121, 122 is on the sidewall of the free layer 120 in order to maximize the impact of the spin current injected into the free layer 120 by current flowing through the SOT segment 121, 122. In some embodiments such as that discussed with respect to FIGS. 11 and 12 below, there may be intervening material between the SOT segment 121, 122 and the free layer 120 as long as the intervening material does not negate the desired impact of the spin current generated in the SOT segment 121, 122 or interfere with flow of the spin current between the SOT segment 121, 122 and the free layer 120. Such an intervening material may be a metal layer or a dielectric layer that is thin enough to allow tunneling of the spin current from the SOT segment 121, 122 to the free layer 120.

In order to generate the desired spin orbit torque, the SOT segment 121, 122 can be formed using material that has a strong interaction between its lattice and the spin of the charge carriers (e.g. electrons). Such a material is able to create a significant spin polarization of the scattered electrons. Examples of such as materials, which exhibit a strong Spin Hall Effect, include tantalum (Ta), tungsten (W), and platinum (Pt). The materials can also include different phases of these materials, including, for example, Beta-Ta and Beta-W. Some of these materials are positive SOT materials that result in SOT current in a first direction as a result of a particular current flow, whereas others are negative SOT materials that result in an opposite SOT current for the particular current flow.

FIG. 3 illustrates the magnetoresistive device 200, which has the same structure as the device 100 of FIG. 1. However, in FIG. 3, the applied write current 202 is directed upward instead of downward like the current 102 in FIG. 1. The upward write current 202 is reflected in FIG. 4, which provides a top view of the device 200 of FIG. 3 and indicates the upward directed current 202 with dots (current coming out of the page) instead of Xs (current going into the page as in FIG. 2).

In the embodiment depicted in FIG. 3, the upward write current 202 splits into two portions—one of which flows through the SOT segment 121, 122 and the other of which flows through the free layer 120. The current through the SOT segment 121, 122 results in SOT current that has an inward directed torque depicted by arrows 223 and 224 in FIGS. 3 and 4. As was the case with the outward directed torque in FIGS. 1 and 2, the torque applied by the SOT current in FIG. 3 tips the magnetization of the free layer 102 off of its easy axis, thereby making it easier to switch using STT current that flows through the free layer 120. In the example of FIG. 3, the inward directed torque 223, 224 of the SOT current combined with the upward directed torque 225 of the STT current can be used to switch the magnetization of the free layer 220 from the downward directed state to the upward directed state. Thus, write current in one direction forces the magnetic state of the free layer into the first state, whereas write current in a second direction forces the free layer into the second state.

FIGS. 5 and 6 illustrate an embodiment in which the SOT segment 321 is only positioned on one side of the magnetoresistive device 300. Such an embodiment may be appropriate for smaller (20 nm or less) devices in which the free layer 320 switches all at once. This is in contrast to larger devices that may include different portions that switch at different times, which may be referred to as "multi-domain switching." The device 300 is shown to include a reference layer 340, which, as discussed above can be a SAF or other multi-layer structure. The dielectric layer 330 is between the reference layer 340 and the free layer 320, which lies under the top electrode 310. The downward directed write current 302 results in STT 325 directed downward as well as SOT 323 directed outward on the side of the free layer 320 adjacent to the SOT segment 321.

Figures 7, 8:
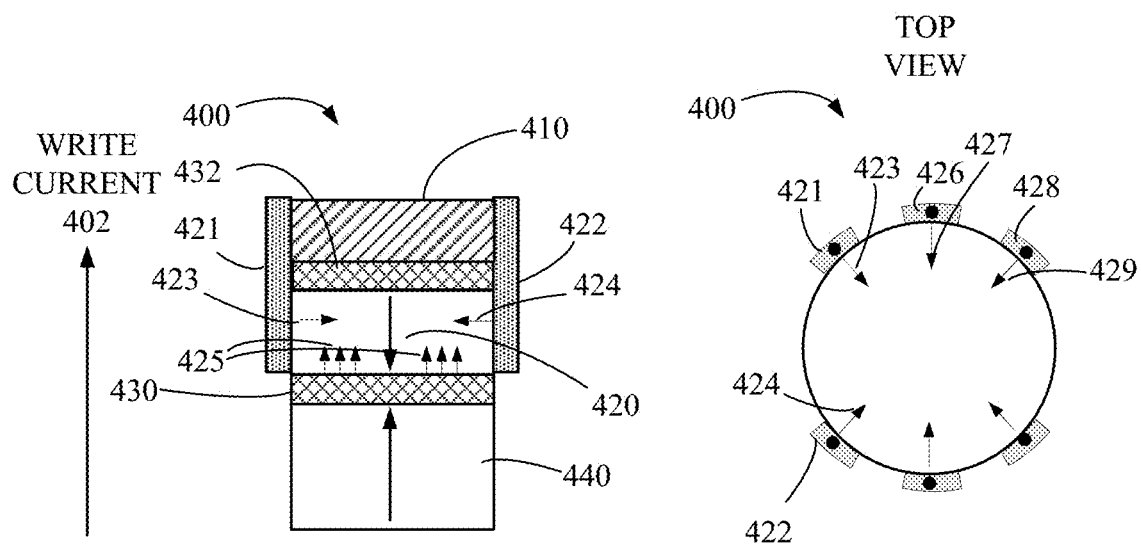
FIG. 7 is a block diagram of magnetoresistive device in accordance with an exemplary embodiment.
FIG. 8 is a top-down perspective view of the magnetoresistive device of FIG. 7.

FIGS. 7 and 8 illustrate an embodiment in which the SOT segment has been divided into a plurality of sub-segments, including sub-segments 421, 422, 426, and 428. The sub-segments shown are not evenly spaced around the circumference of the stack structure (as can be seen in FIG. 6), but in other embodiments, such equal spacing may be employed. The number of sub-segments can be selected based on the particular application or to complement the structure of the free layer 420 or the overall device 400. While the embodiments presented herein are primarily focused on two-terminal devices, individual or group control of the sub-segments 421, 422, 426, and 428 is also contemplated, where current through one or more of the sub-segments can be controlled separate from the control of current flow through the MTJ of the device 400. While such additional control adds complexity, it may be appropriate in some applications where the tradeoffs warrant such additional control.

In the embodiment of FIGS. 7 and 8 the SOT current generated by the SOT sub-segments, including sub-segments 421, 422, 426, and 428, is directed inward (shown by arrows 423, 424, 427, and 429) and can provide an assist in switching the free layer 420 included in the device 400. The device 400 is shown to include a reference layer 440, which, as discussed above can be a SAF or other multi-layer structure. The dielectric layer 430 is between the reference layer 440 and the free layer 420, and the upward directed write current 402 results in STT 425 directed upward as well as SOT 423, 424, 427, and 429 directed inward from the sidewalls of the free layer 420 adjacent to the SOT sub-segments.

The magnetoresistive device 400 also includes a second dielectric layer 432 between the free layer 420 and the top electrode 410. The second dielectric layer 432, which may be of the same or different composition than the first dielectric layer 420, can help to improve the perpendicular magnetic anisotropy (PMA) of the free layer. In some MTJ stacks, the PMA of the free layer is enhanced by placing layers of material, such as MgO or other material, at the top and bottom surfaces of the free layer. Such increased PMA can help to make the free layer strongly perpendicular such that the magnetic state of the free layer is stable enough to resist moderate applied magnetic fields and elevated temperatures. Higher PMA can in data retention as the free layer is able to hold its magnetic state for extended periods of time.

In some embodiments, the second dielectric layer 432 is referred to as a second tunnel barrier, even though it may not function in the same manner as the first dielectric layer 420 that acts as a tunnel barrier for the MTJ in the device 400. The second dielectric layer 432 can also be referred to as a "spacer" layer. The second dielectric layer can help improve the effectiveness of STT current flowing through the device as reflected spin current may provide weaker torque, and having a dielectric layer on both sides of the free layer 420 avoids the reliance on such weaker reflected spin current for the STT portion of the switching.

As shown in FIG. 7, the SOT segment, including sub-segments 421 and 422 extend along the sidewalls of the device from the top electrode 410 across the second dielectric layer 432 and through the free layer 420, thereby shorting out the second dielectric layer 432. Therefore in order to ensure that current flows through the second dielectric layer 432 and the free layer 420 directly, the resistance of those layers is considered along with the resistance of the SOT segment. Tuning of those resistances can be used to determine the appropriate amount of current flow through each of those respective portions of the device 400.

In the example illustrated in FIGS. 7 and 8, the upward-directed write current 402 results in inward SOT 423, 424, 427, and 429 as well as upward-directed STT 425. The combination of the torques can be used to switch the magnetization of the free layer 420 from the downward state shown to the upward pointing state. The SOT induced by the current flowing through the SOT segment assists in the switching by moving the magnetization of the free layer 420 away from its equilibrium state, thereby "loosening" the magnetization and making it easier for the STT current to switch the magnetization of the free layer 420.

Figure 9:
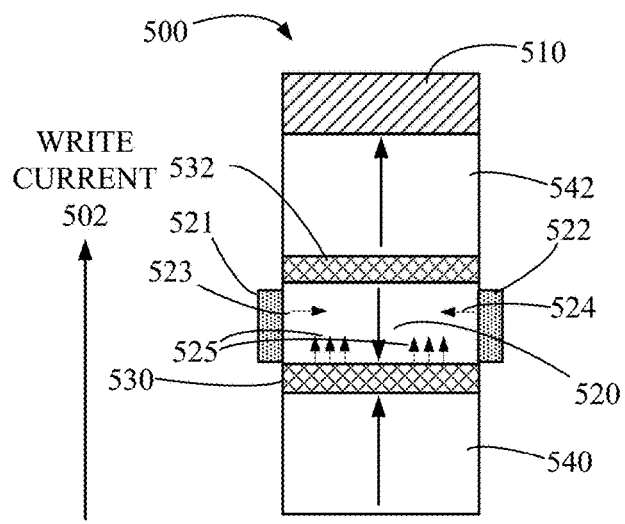
FIG. 9 is a block diagram of magnetoresistive device in accordance with an exemplary embodiment.
Figure 10:
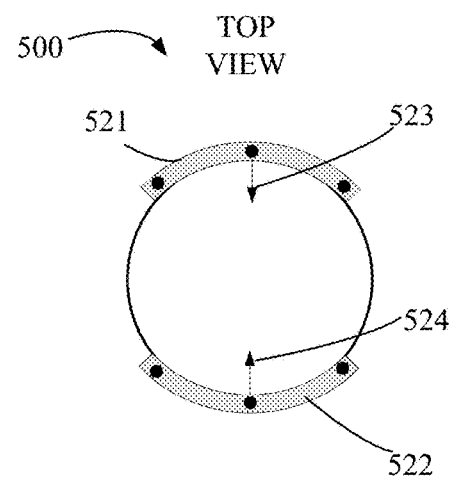
FIG. 10 is a top-down perspective view of the magnetoresistive device of FIG. 9.

In the embodiment illustrated in FIGS. 9 and 10, a second reference layer 542 is included in the magnetoresistive device 500. As such, the magnetoresistive device 500 includes a top electrode 510, a second reference layer 542, a second dielectric layer 532, a free layer 520, a first dielectric layer 530, and a first reference layer 540. Each of the reference layers 540 and 542 can include SAFs or other combinations of magnetic and non-magnetic layers as discussed above. In some examples, the device 500 depicted in FIGS. 9 and 10 can be referred to as a "dual spin filter" and can be considered to include two MTJs.

In the embodiment of FIGS. 9 and 10, the SOT segment 521, 522 is shown to only be positioned along the sidewalls of the free layer 520, thereby avoiding shorting out either of the dielectric layers 530 and 532. Note that in other embodiments, one or both of the SOT sub-segments 521 and 522 can extend across one or both of the dielectric layers 530 and 532. The upward-directed write current 502 results in current flowing through the SOT segments 521, 522, which results in SOT current producing inward directed torque represented by arrows 523 and 524. The write current 502 also results in current flowing through the free layer 520, which results in torque 525 produced by the STT current.

While the various embodiments depicted in FIGS. 1-10 show the top electrode and a reference layer under the free layer, the vertical orientation of each of those embodiments can be reversed such that the free layer is below the dielectric layer forming the tunnel barrier and the reference layer is above the tunnel barrier. Similarly, it should be understood that the various permutations of multiple SOT sub-segments, the inclusion of additional dielectric layers or reference layers, or the other variations in the embodiments depicted and described can be applied in various combinations in accordance with different embodiments disclosed herein.

Similarly, while the SOT segment is depicted as covering the entirety of the side surface or sidewall of the free layer, in other embodiments the SOT segment only covers a portion of the side surface of the free layer. Covering more of the side surface allows for more efficient injection of spin current into the free layer by the SOT segment. In some embodiments, the SOT segment can cover a portion of the side surface of the dielectric layer as long as it does not short out or otherwise adversely impact the tunnel barrier formed by the dielectric layer or interfere with the operation of the device.

The SOT segment is also depicted as relatively narrow in relation to the width of the device. The current density within the SOT segment determines the amount of spin current generated in the free layer. As such, different SOT segment geometries can be used to optimize the strip line performance, including the line resistance per length, the required voltage bias to drive the current, and the total current through the line to achieve the highest current density. Such SOT segment optimization can be used to maximize the amount of spin torque applied to the free layer by the current in the SOT segment given the practical constraints of the supporting circuitry and the array architecture.

Figure 11:
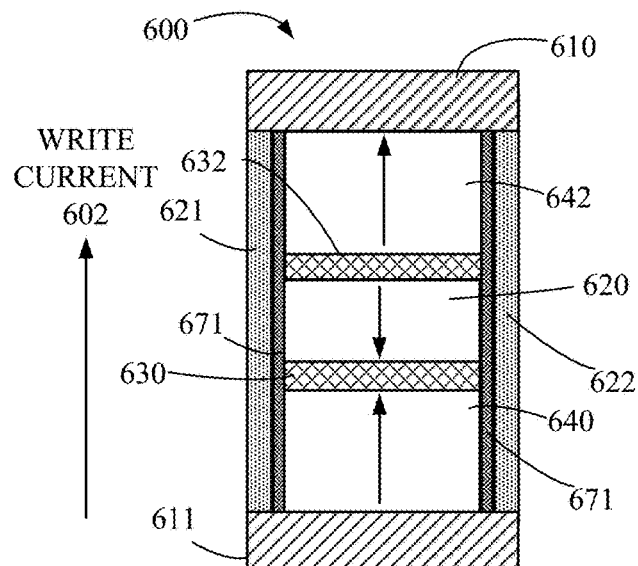
FIG. 11 is a block diagram of magnetoresistive device in accordance with an exemplary embodiment.
Figure 12:
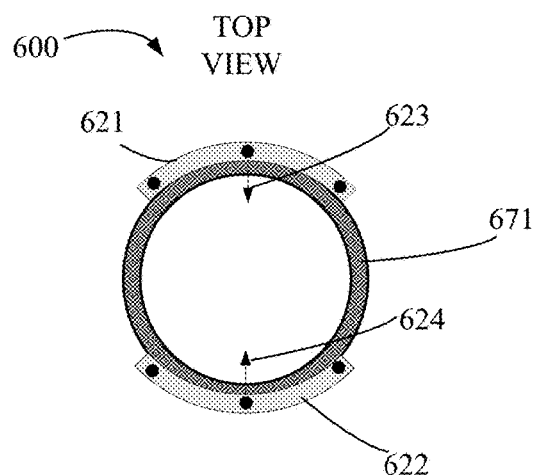
FIG. 12 is a top-down perspective view of the magnetoresistive device of FIG. 11.

FIGS. 11 and 12 illustrate another embodiment in which the SOT segment 621, 622 is shown to extend all along the sidewalls of the device 600 between the top electrode 610 and a bottom electrode 611. The device 600 is shown to include multiple reference layers 640 and 642, which may be SAFs, multiple dielectric layers 630 and 632, and free layer 620. The upward directed write current 602 is split between current flowing through the SOT segment 621, 622 and current flowing through the reference, free, and dielectric layers.

In the embodiment depicted in FIGS. 11 and 12, the SOT segment 621, 622 is separated from the magnetoresistive stack by a thin layer 671 that insulates the stack from the SOT segment in terms of direct current flow, but allows the SOT generated within the SOT segment to still impact the free layer such that it can aid in switching. Thus in some embodiments, the layer 671 is an electrically insulating layer that still allows for SOT to be applied to the free layer 620 in response to current flow through the SOT segment 621, 622. For the upward-directed write current 602 depicted in FIGS. 11 and 12, the SOT is represented by the inward pointing arrows 623 and 624 shown in FIG. 12.

Figures 13, 14:
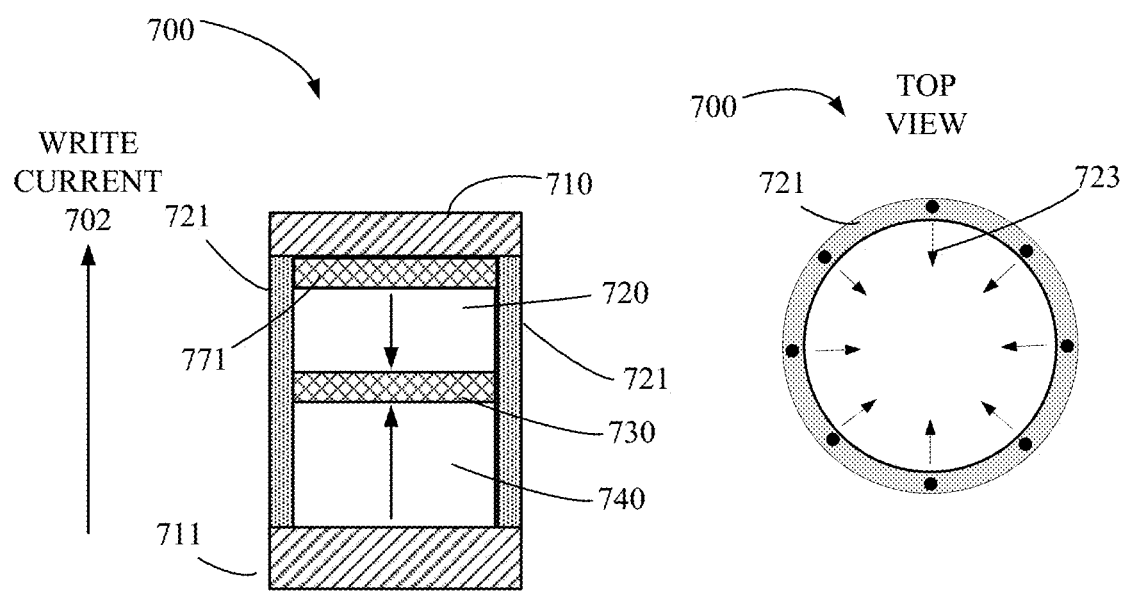
FIG. 13 is a block diagram of magnetoresistive device in accordance with an exemplary embodiment.
FIG. 14 is a top-down perspective view of the magnetoresistive device of FIG. 13.

FIGS. 13 and 14 illustrate another embodiment in which the SOT segment 721 extends along the entirety of the sidewall of the stack between the top electrode 710 and the bottom electrode 721. Moreover, the SOT segment 721 also extends completely around the stack and forms a ring. The device 700 is shown to include two dielectric layers 771 and 730, reference layer 740, and free layer 720. Upward-directed write current 702 results in the SOT from the current in the SOT segment 721 being directed inward, as shown by the arrows in FIG. 14, including arrow 723. In the example embodiment shown in FIGS. 13 and 14, the SOT segment is not insulated from the stack and therefore shorts out the various layers in the stack. In order to read the data stored based on the orientation of the free layer, the resistance of the various layers can be tuned in order to ensure that adequate magnetoresistance is discernable by read current flowing through the device 700.

Figure 15:
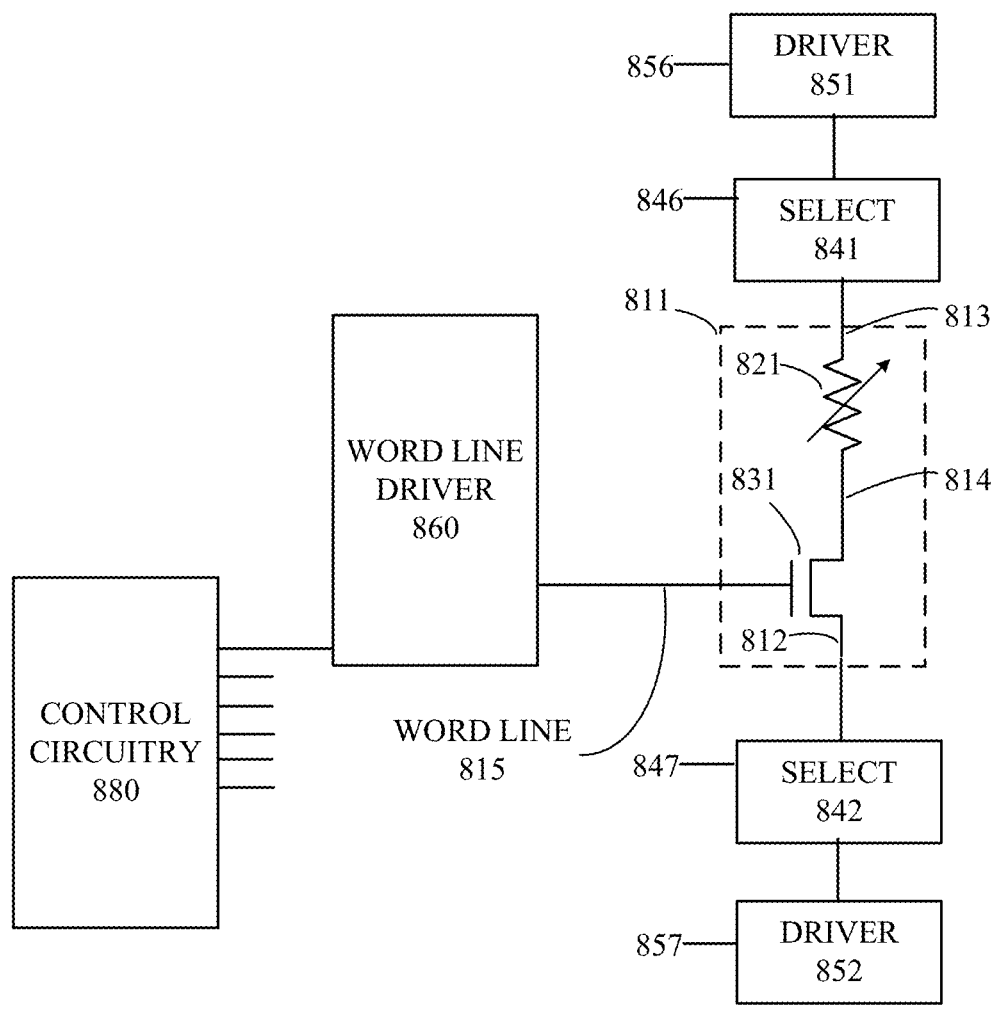
FIG. 15 is a block diagram of a magnetic memory apparatus in accordance with an exemplary embodiment.

The full-ring SOT segment may be particularly suited to larger footprint devices such as those that are greater than 20 nm and, in other embodiments, 30 nm or larger. The full-ring SOT segment may be beneficial in switching larger magnetoresistive device sizes because such larger devices may rely on domain mediated switching. The inward directed SOT shown in FIG. 14 would result in a depression in the magnetization of the free layer 720 around the outside edge that, along with the STT resulting from current flowing through the free layer 720, can force the free layer 720 to change state. While such an embodiment may not be the most efficient for all applications, a person of ordinary skill in the art recognizes that there are various tradeoffs that can be considered in choosing the particular implementation of a magnetoresistive device that includes an SOT segment, FIG. 15 illustrates a magnetic memory apparatus that includes a memory cell 811. Memory cell 811 includes a magnetoresistive device 821 that includes a magnetic tunnel junction such as those discussed above with respect to FIGS. 1-14. The magnetoresistive device 821, which is a two-terminal device, is coupled in series with selection transistor 831. The magnetoresistive device 821 has a first terminal corresponding to node 813 and a second terminal corresponding to node 814. The first end of the selection transistor 831 is coupled to the second terminal of the magnetoresistive device 821 at node 814. The second end of the selection transistor 831 is coupled to node 812. In some embodiments, nodes 812 and 813 are common lines such as a source line and a bit line, where such common lines are typically coupled to a large number of memory cells. Select circuits 841 and 842, which are controlled by inputs 846 and 847, respectively, enable drivers 851 and 852 to be selectively coupled to different bit lines and source lines as appropriate for the operation to be performed. Drivers 851 and 852 can be enabled by inputs 856 and 857.

In order to select the memory cell 811 from a plurality of memory cells coupled to the bit line 813 and the source line 812, word line 815 is asserted high such that selection transistor 831 allows current to be conducted through the series circuit formed by the selection transistor 831 and the magnetoresistive device 821. Selection transistor 831 is typically a thin oxide transistor, which, if subjected to a relatively high gate-to-source (Vgs) voltage, can breakdown and fail to operate properly.

Control circuitry 880 is coupled to the word line driver 860 and the other circuit elements shown in FIG. 15, where the control circuitry 880 is configured to provide the appropriate control signals to the various circuit blocks in order to cause the desired voltages to be applied and currents to flow through the magnetoresistive device 821. Control circuitry 880 may include, for example, a state machine, processor, microcontroller, or logic circuitry. Control circuitry 880 is used to select the appropriate word line voltage 815 to be applied by the word line driver 860. Control circuitry 880 can also enable drivers 851 and 852 via inputs 856 and 857 in order to cause those drivers 851 and 852 to drive desired voltages corresponding to read and write operations for the memory cell 811. For example, the drivers 851 and 852 can be used to generate write current through the magnetoresistive device 821, where the direction of the write current generated determines the data stored in the memory cell 811. Similarly, control circuitry 880 can enable select circuits 841 and 842 using inputs 846 and 847 in order to cause those select blocks to couple the drivers 851 and 852 to the appropriate bit lines and source lines.

As disclosed herein, SOT segments are provided along the sides of free layers in magnetoresistive devices that include MTJs. Such SOT segments provide spin current to the free layers such that spin-orbit torque is applied to the free layers in a manner that can alter the magnetic state of the free layers. In some embodiments, the SOT current provides an assist to spin-torque generated by current flowing vertically through the magnetic tunnel junction. Some embodiments have SOT segments that include multiple sub-segments. Other embodiments vary in terms of the various layers included in the stack of the magnetoresistive device as well as the geometry and composition of the layers.

Although the described exemplary embodiments disclosed herein are directed to various magnetoresistive-based devices, the present disclosure is not necessarily limited to the exemplary embodiments. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetoresistive device, comprising:
a first electrode;
a reference layer having a fixed magnetic state;
a free layer having a magnetic state, where the magnetic state of the free layer stores a first value when in a first magnetic state and stores a second value when in a second magnetic state;
a dielectric layer between the free layer and the reference layer;
a spin orbit torque (SOT) segment proximate to at least a portion of the free layer; and
an insulating layer between the SOT segment and the free layer; wherein electric current through the SOT segment generates spin current.

2. The magnetoresistive device of claim 1, wherein electric current though the SOT segment generates spin current capable of switching the magnetic state of the free layer from the first magnetic state to the second magnetic state.

3. The magnetoresistive device of claim 1, further comprising control circuitry electrically connected to the SOT segment.

4. The magnetoresistive device of claim 3, wherein the control circuitry is connected to one or more drivers, and the one or more drivers are capable of delivering a read current and a write current to SOT segment.

5. The magnetoresistive magnetoresistive device of claim 1, wherein the SOT segment contacts the insulating layer.

6. The magnetoresistive device of claim 1, wherein the free layer contacts the insulating layer.

7. The magnetoresistive device of claim 1, wherein the SOT segment includes a plurality of sub-segments, wherein each sub-segment of the plurality of sub-segments is at a different radial position of the magnetoresistive device.

8. The magnetoresistive device of claim 7, wherein the plurality of sub-segments includes a first sub-segment and a second sub-segment, wherein the first and second sub-segments are on opposing sides of the free layer.

9. The magnetoresistive device of claim 1, wherein resistance of the SOT segment perceived by the current through the SOT segment is about equal to resistance of the free layer perceived by the current through free layer.

10. The magnetoresistive device of claim 1, wherein the first magnetic state and the second magnetic state correspond to magnetic states that are perpendicular with respect to a plane in which layers of the magnetoresistive device are formed.

11. A magnetoresistive device, comprising:
a first electrode;
a reference layer having a fixed magnetic state;
a free layer having a magnetic state, where the magnetic state of the free layer stores a first value when in a first magnetic state and stores a second value when in a second magnetic state;
a dielectric layer between the free layer and the reference layer;
a spin orbit torque (SOT) segment proximate to at least a portion of the free layer, wherein electric current through the SOT segment generates spin current; and
control circuitry electrically connected to the SOT segment, wherein the control circuitry is connected to one or more drivers, and the one or more drivers are capable of delivering a read current and a write current to SOT segment.

12. The magnetoresistive device of claim 11, wherein the spin current generated as a result of electric current through the SOT segment is propagated in a direction perpendicular to the current through the SOT segment and perpendicular to surface of the free layer.

13. The magnetoresistive device of claim 11, wherein the SOT segment includes one or more of platinum, tungsten, or tantalum.

14. The magnetoresistive device of claim 11, wherein the reference layer is a synthetic antiferromagnet (SAF).

15. The magnetoresistive device of claim 11, wherein the SOT segment includes a plurality of sub-segments, wherein each sub-segment of the plurality of sub-segments is at a different radial position of the magnetoresistive device.

16. The magnetoresistive device of claim 15, wherein the plurality of sub-segments includes a first sub-segment and a second sub-segment, wherein the first and second sub-segments are on opposing sides of the free layer.

17. The magnetoresistive device of claim 11, wherein the dielectric layer is a first dielectric layer and the magnetoresistive device further includes a second dielectric layer.

18. A magnetoresistive device comprising:
a first electrode;
a synthetic antiferromagnetic (SAF) having a fixed magnetic state and including:
a first magnetic layer;
a second magnetic layer; and
a coupling layer disposed between the first magnetic layer and the second magnetic layer;
a free layer having a magnetic state, where the magnetic state of the free layer stores a first value when in a first magnetic state and stores a second value when in a second magnetic state;
a dielectric layer between the free layer and the SAF;
a spin orbit torque (SOT) segment, wherein electric current through the SOT segment generates spin current;
an insulating layer; and
control circuitry electrically connected to the SOT segment, wherein the control circuitry is connected to one or more drivers, and the one or more drivers are capable of delivering a read current and a write current to SOT segment.

19. The magnetoresistive device of claim 18, wherein the SAF is a first SAF and the magnetoresistive device further comprises a second SAF, wherein the free layer is between the first SAF and the second SAF.

20. The magnetoresistive device of claim 19, wherein resistance of the SOT segment perceived by the current through the SOT segment is about equal to resistance of the free layer perceived by the current through free layer.

* * * * *